United States Patent
Sasaki

(10) Patent No.: US 7,129,799 B2
(45) Date of Patent: Oct. 31, 2006

(54) PIEZOELECTRIC VIBRATION ELEMENT AND PIEZOELECTRIC FILTER

(75) Inventor: Yukinori Sasaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 10/473,761

(22) PCT Filed: Mar. 29, 2002

(86) PCT No.: PCT/JP02/03176

§ 371 (c)(1),
(2), (4) Date: Feb. 19, 2004

(87) PCT Pub. No.: WO02/082646

PCT Pub. Date: Oct. 17, 2002

(65) Prior Publication Data

US 2004/0155716 A1    Aug. 12, 2004

(30) Foreign Application Priority Data

Apr. 2, 2001    (JP)    ............... 2001-103241

(51) Int. Cl.
*H03B 5/32*    (2006.01)
(52) U.S. Cl. ............. 331/158; 331/116 R; 310/323.06; 310/311
(58) Field of Classification Search ................ 331/158, 331/116 R; 310/324, 346, 311, 323.06
See application file for complete search history.

(56) References Cited

U.S. PATENT DOCUMENTS 4,456,850 A * 6/1984 Inoue et al. ................. 310/324
5,399,997 A * 3/1995 Yoshida ...................... 331/158

FOREIGN PATENT DOCUMENTS

| JP | 49-32864 | 9/1974 |
|---|---|---|
| JP | 55-93315 | 7/1980 |
| JP | 59-182616 | 10/1984 |
| JP | 62-220012 | 9/1987 |
| JP | 6-37579 | 2/1994 |
| JP | 8-242026 | 9/1996 |
| JP | 9-8594 | 1/1997 |

OTHER PUBLICATIONS

International Search Report corresponding to applicaiton No. PCT/JP02/03176 dated Jul. 2, 2002.
"Analysis of Piezoelectric Resonators Vibrating in Trapped Energy Modes" by Morio Onoe et al.; Magazine of Institute of Telecommunications Engineers, vol. 48, No. 9, Sep. 1965, pp. 1574(70)-1581 (77) with a partial English translation.
"Energy Trapping and Related Studies of Multiple Electrode Filter Crystals" by William Shockley et al.; 17th Ann. Freq, Control Symposium, 1963 pp. 88-126.

* cited by examiner

*Primary Examiner*—Arnold Kinkead
(74) *Attorney, Agent, or Firm*—RatnerPrestia

(57) ABSTRACT

A piezoelectric oscillator using zinc oxide as a piezoelectric plate which eliminates unwanted resonance called inharmonic overtone by optimizing ratio Le/H of driving electrode length Le to oscillator thickness H. Ratio Le/H is set between 4 and 100 in the piezoelectric oscillator polarized in a thickness direction of a piezoelectric plate and using thickness extension vibration as main vibration or the piezoelectric oscillator polarized in a length direction of the piezoelectric plate and using thickness shear vibration as main vibration. This achieves stable characteristic because no unwanted resonance exists between the resonance frequency and anti-resonance frequency of the main vibration.

15 Claims, 10 Drawing Sheets

Electric charge distribution in s_0 mode

Electric charge distribution in a_0 mode

Polarizing direction

Polarizing direction

Polarizing direction

Polarizing direction ⬆

Polarizing direction

PIEZOELECTRIC VIBRATION ELEMENT AND PIEZOELECTRIC FILTER

THIS APPLICATION IS A U.S. NATIONAL PHASE APPLICATION OF PCT INTERNATIONAL APPLICATION PCT/JP02/03176.

TECHNICAL FIELD

The present invention relates to piezoelectric oscillators and piezoelectric filters using zinc oxide as a piezoelectric material.

Background Art

Piezoelectric oscillators using a bulk wave traveling through a solid includes piezoelectric oscillators employed as a clock source for diversifying electronic apparatuses and piezoelectric filters for extracting frequencies in communications apparatuses. Recently, operating frequency bands of these piezoelectric oscillators are becoming increasingly higher. In these piezoelectric oscillators, thickness vibration such as thickness shear vibration and thickness extension vibration is used as main vibration. In particular, the energy trapping phenomenon which facilitates the suppression of unwanted vibration and retention of the oscillator is often applied. Energy trapping is a phenomenon that vibration energy is confined under a driving electrode formed partially on the main face of the piezoelectric oscillator when a specific piezoelectric material is used and a specific vibration mode such as thickness shear vibration and thickness extension vibration is used. This phenomenon is analyzed in details by Shockley, Onoe and other researchers.

Energy trapping is described next with reference to a sectional view of piezoelectric oscillator 5 in FIG. 18. As shown in FIG. 18, when a cutoff frequency at a part where driving electrode 6 is formed is f0 and a cutoff frequency of a non-electrode section is f0s, vibration energy freely propagates at frequencies higher than f0s, and a standing wave is not generated even under the driving electrode. However, when frequencies higher than f0 and lower than f0s are applied, vibration energy freely propagates at a part where driving electrode 6 exists but the vibration energy attenuates exponentially at the non-electrode section. In line with this phenomenon, the vibrational displacement also reduces toward an end of piezoelectric oscillator 5. As a result, vibration energy concentrates around the driving electrode.

As an index for a energy-trapping level, energy-trapping amount $\zeta$ is calculated by next equation (1):

$$\zeta = Le/H \times ((f0s-f0)/f0s)^{1/2} \quad (1)$$

where,

Le: Length of the driving electrode; and

H: Thickness of the oscillator.

FIG. 19 shows, as an example, the frequency spectrum of the thickness shear oscillator using an X plate of lithium tantalate. In FIG. 19, the horizontal axis shows energy-trapping amount $\zeta$ and the vertical axis shows normalized frequency $\Omega$. This $\Omega$ is calculated by equation (2):

$$\Omega = (f-f0)/(f0s-f0) \quad (2).$$

In FIG. 19, s_0, s_1, and so on are a symmetry mode, and a_0, a_1, and so on are an asymmetry mode. The electric charge distribution in each mode is indicated near the curve indicating each mode. It is apparent from the electric charge distribution in FIG. 19 that the asymmetry mode such as a_0, a_1, and so on is not electrically excited if the driving electrode is disposed symmetrical to the oscillator. Accordingly, only the symmetry mode such as s_0, s_1, and so on can be electrically taken out.

However, in case of the piezoelectric oscillator, vibrations other than s_0, the main vibration, become unwanted resonance called inharmonic overtone. Therefore, the energy-trapping amount $\zeta$ needs to be set to the value that allows confinement of energy only in the s_0 mode. The Japanese Laid-open Patent No. S59-182616, for example, defines that energy-trapping amount $\zeta$ that confines energy only in the s_0 mode is 1.2 or smaller. The amount of frequency drop (f0s−f0)/f0s is mostly dependent on the piezoelectric material and is about 0.1. Accordingly, Patent No. S59-182616 describes that the single s_0 mode is made feasible by setting Le/H to 3.8 or smaller.

However, for the piezoelectric oscillator using zinc oxide as a piezoelectric material, a designed value for electrode which does not generate unwanted resonance called inharmonic overtone is not yet identified.

DISCLOSURE OF INVENTION

The present invention offers a piezoelectric oscillator using zinc oxide as a piezoelectric material. Unwanted resonance called inharmonic overtone is eliminated by optimizing ratio Le/H of driving electrode length Le to oscillator thickness H in the piezoelectric oscillator using thickness extension vibration or thickness shear vibration as main vibration.

Moreover, a ladder-type piezoelectric filter or multi-mode piezoelectric filter is manufactured by employing the piezoelectric oscillator of the present invention. These piezoelectric filters demonstrate stable filter characteristic without ripple in a passband because each oscillator features stable characteristic without unwanted resonance.

DETAILED DESCRIPTION OF PREFERRED EMBODIMENT

Figure 1:
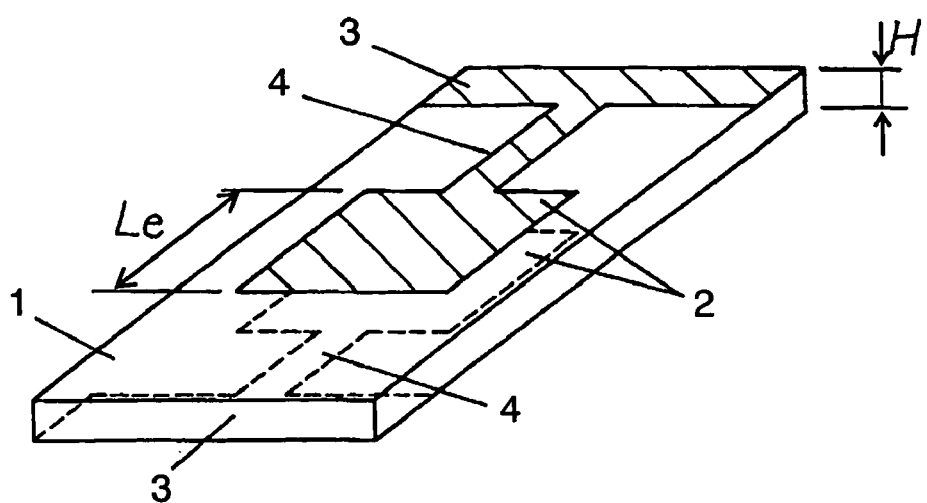
FIG. 1 is a perspective of a piezoelectric oscillator in accordance with exemplary embodiments of the present invention.
Figure 2:
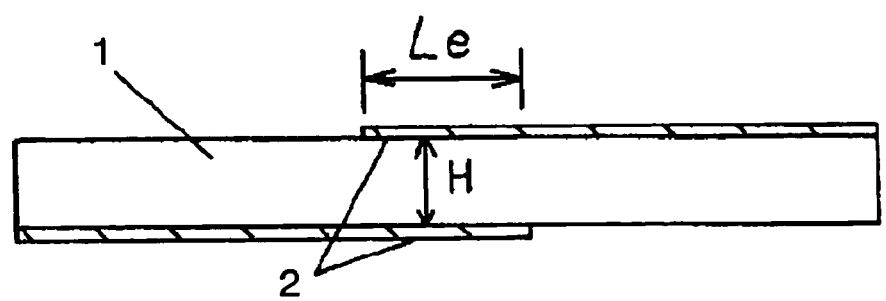
FIG. 2 is a sectional view of the piezoelectric oscillator of the present invention.

A piezoelectric oscillator of the present invention using zinc oxide as a piezoelectric material, is polarized in a thickness direction of a piezoelectric plate, and uses thickness extension vibration as main vibration. In this piezoelectric oscillator, ratio Le/H of driving electrode length Le to oscillator thickness H is set between 4 and 13. This achieves stable characteristic by eliminating unwanted resonance between resonance frequency and anti-resonance frequency of the main vibration.

In addition, the piezoelectric oscillator of the present invention sets ratio Le/H of driving electrode length Le to thickness H between 4 and 100 instead of 4 and 13 when thickness H of the oscillator is 16 μm or thinner. This retains resonance impedance of the main vibration small even at high frequencies, and achieves stable characteristic without unwanted resonance.

Still more, the piezoelectric oscillator of the present invention uses zinc oxide as a piezoelectric material, is polarized in a length direction of the piezoelectric plate, and uses thickness shear vibration as main vibration. In this piezoelectric oscillator, ratio Le/H of driving electrode length Le to oscillator thickness H is set between 7 and 23. This achieves stable characteristic by eliminating unwanted resonance between resonance frequency and anti-resonance frequency of the main vibration.

Still more, the piezoelectric oscillator of the present invention sets ratio Le/H of driving electrode length Le to thickness H between 7 and 100 instead of 7 and 23 when oscillator thickness H is 14 μm or thinner. This retains resonance impedance of the main vibration small even at high frequencies, and achieves stable characteristic without unwanted resonance.

A piezoelectric filter of the present invention is a ladder-type piezoelectric oscillator which employs at least two or more electrically-coupled piezoelectric oscillators described above. Ratio Le/H of driving electrode length Le to oscillator thickness H is designed to be optimal. Since each oscillator features stable characteristic without unwanted resonance, a stable filter characteristic without ripple in a passband is achievable.

Still more, the piezoelectric filter of the present invention is a double-mode piezoelectric filter which employs the piezoelectric oscillator having an optimum ratio of driving electrode length to the oscillator thickness, and using thickness extension vibration as main vibration. This piezoelectric filter has a pair of input electrode and output electrode on one main face of the oscillator, and a ground electrode on the other main face. Ratio Li/H of input electrode length Li to oscillator thickness H and ratio Lo/H of output electrode length Lo to oscillator thickness H are set between 2 and 5 respectively. This achieves stable filter characteristic without ripple in a passband.

Still more, the piezoelectric filter of the present invention is a double-mode piezoelectric filter which employs the piezoelectric oscillator having optimum ratio Le/H of driving electrode length Le to oscillator thickness H, and using thickness shear vibration as main vibration. This piezoelectric filter has a pair of input electrode and output electrode on one main face of the oscillator, and a ground electrode on the other main face. Ratio Li/H of input electrode length Li to oscillator thickness H and ratio Lo/H of output electrode length Lo to oscillator thickness H are set between 3.5 and 6.5 respectively. This achieves stable filter characteristic without ripple in a passband.

Next, exemplary embodiments of the present invention are described with reference to FIGS. 1 to 17. The piezoelectric oscillator of the present invention shown in FIG. 1 includes vibrating section 1, driving electrodes 2 provided at positions corresponding to (or facing) each other on top and bottom faces of vibrating section 1, lead electrode 3, and electrode 4 for external draw-out.

The energy trapping amount increases as the driving electrode length becomes longer, but inharmonic overtone such as the s_1 mode and s_2 mode also begins to satisfy energy trapping condition. In this case, the s_1 mode and s_2 mode exist between resonance frequency and anti-resonance frequency of the main vibration and become unwanted resonance. Energy trapping amount ζ is expressed by next equation (1):

$$\zeta = Le/H \times ((f0s - f0)/f0s)^{1/2} \quad (1)$$

where,

Le: Driving electrode length;

H: Oscillator thickness;

f0: Cutoff frequency in driving electrode; and f0s: Cutoff frequency in a non-electrode section.

Since amount of frequency drop (f0s−f0)/f0s is almost constant depending on the piezoelectric material, the energy trapping amount is only affected by Le/H.

In case of the piezoelectric oscillator using zinc oxide as a piezoelectric material, being polarized in a thickness direction of the piezoelectric plate, and using thickness extension vibration as main vibration, behaviors in each vibration mode such as main vibration and inharmonic overtone when oscillator thickness H is kept constant and driving electrode length Le is changed are investigated.

Figure 3:
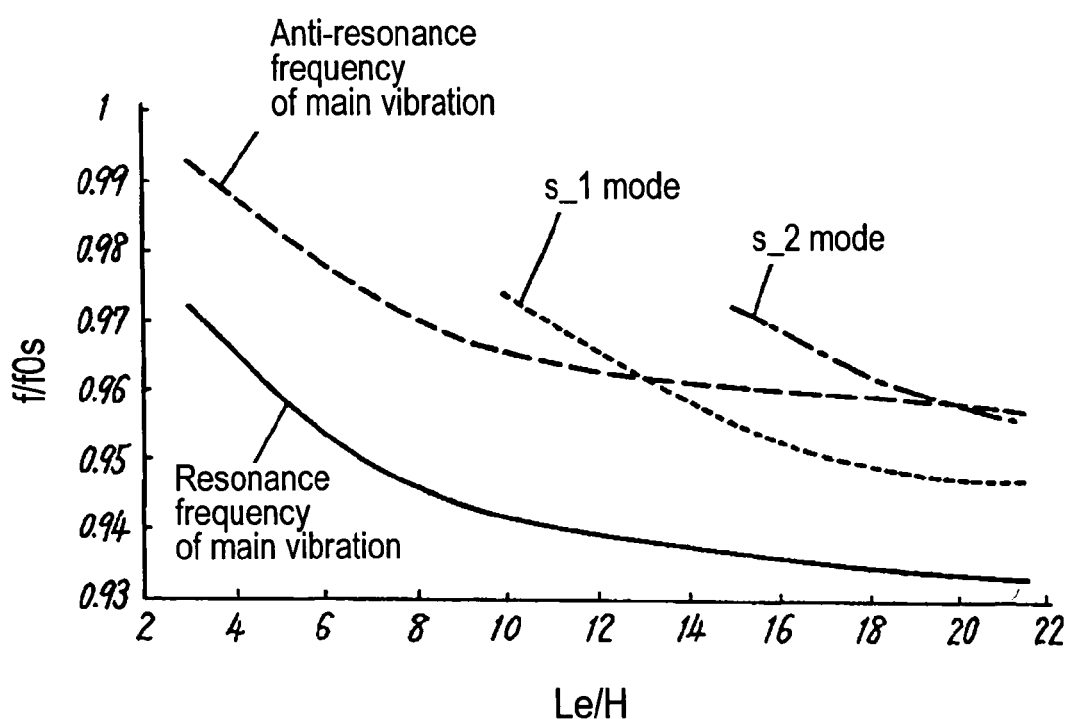
FIG. 3 illustrates frequency spectrum of the piezoelectric oscillator made of zinc oxide, polarized in a thickness direction of a piezoelectric plate, and using thickness extension vibration as main vibration.

Results are shown in the frequency spectrum in FIG. 3. Thickness extension vibration used as the main vibration is isotropical in both length and width directions of the oscillator. Accordingly, the driving electrode is square, and both the length and width of the driving electrode are Le. However, a round electrode is also acceptable taking into account that the main vibration is distributed concentrically to the center of the driving electrode. In this case, the electrode diameter is equivalent to $(2^{1/2} \cdot Le)$.

In FIG. 3, the horizontal axis is ratio Le/H of driving electrode length Le to oscillator thickness H, and the vertical axis is normalized frequency f/f0s which is the ratio of resonance frequency f in each vibration mode to cutoff frequency f0s in the non-electrode section. Anti-resonance frequency of the main vibration is also shown in FIG. 3. It is apparent from FIG. 3 that the resonance frequency in each vibration mode becomes smaller as Le/H increases. The s_1 mode and s_2 mode are not output as signals when Le/H is 10 or below in the s_1 mode and Le/H is 15 or below in the s_2 mode because they do not satisfy the energy-trapping condition.

However, the s_1 mode and s_2 mode begin to exist between the resonance frequency and anti-resonance frequency of the main vibration when Le/H is 13 or above in the s_1 mode and Le/H is 21 or above in the s_2 mode respectively. In this case, unstable action such as jumping of the oscillatory frequency may occur if the oscillator is used as an oscillator.

Accordingly, no unwanted resonance exists between the resonance frequency and anti-resonance frequency of the main vibration when Le/H is 13 or below, but too small Le/H leads to reduced electromechanical coupling coefficient which indicates the conversion efficiency of electric energy and mechanical energy due to insufficient energy trapping amount. In the experiment, Le/H of 4 or above is found to achieve preferable characteristic without reducing the electromechanical coupling coefficient too much.

Based on the above results, the piezoelectric oscillator using zinc oxide as a piezoelectric material, being polarized in a thickness direction of the piezoelectric plate, and using thickness extension vibration as main vibration demonstrates stable characteristic without unwanted resonance between the resonance frequency and anti-resonance frequency of the main vibration when Le/H is between 4 and 13.

Figure 4A:
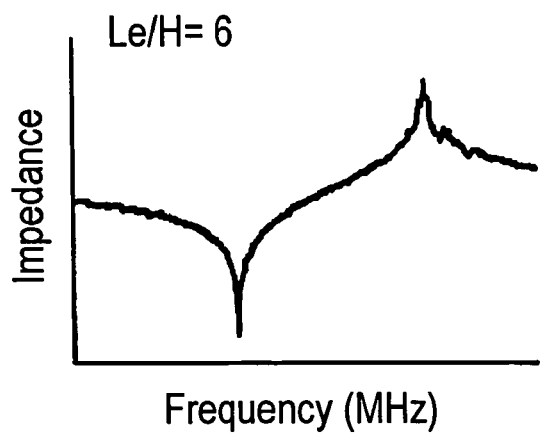
FIG. 4A is an impedance frequency chart of the oscillator in accordance with the exemplary embodiments of the present invention.
Figure 4B:
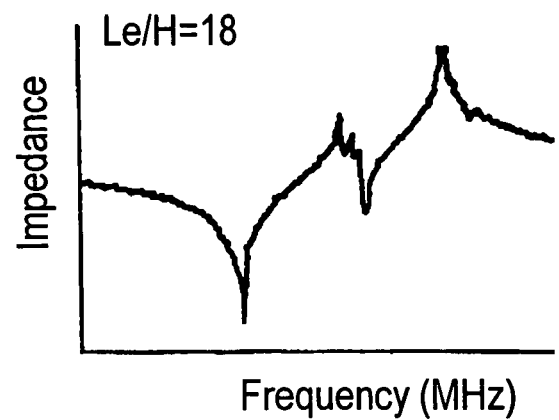
FIG. 4B is an impedance frequency chart of a oscillator in accordance with Comparison.

As an example, FIGS. 4A and 4B show impedance frequency characteristic of the oscillator when Le/H is 6 and 18 respectively. It is apparent from FIG. 4A that preferable characteristic without unwanted resonance between the resonance frequency and anti-resonance frequency of the main vibration is achieved when Le/H is 6 and within the aforementioned range (i.e., between 4 and 13). For comparison, FIG. 4B shows the case when Le/H is 18, which is out of the aforementioned range. In this case, unwanted resonance equivalent to the s_1 mode exists between the resonance frequency and anti-resonance frequency of the main vibration, degrading the characteristic.

The frequency stability of the oscillator is better when mechanical quality factor Q which expresses the resonance sharpness of the oscillator is larger. When the oscillator is used as a filter, it also has a benefit that insert loss becomes smaller. It is known that Q becomes smaller when the operating frequency increases. A level of reduction of Q also differs by vibration mode. When the oscillator or filter is operated at high frequencies, an area of driving electrode is often enlarged in order to achieve low impedance and high Q. If the area of driving electrode, i.e. driving electrode length, is too large when the operating frequency is low, the resonance frequency of the s_1 mode becomes closer to the resonance frequency of the main vibration, as shown in FIG. 3. If there is not much difference in resonance impedance between these two modes, problems such as jumping of the oscillatory frequency may occur.

On the other hand, if the operating frequency is high, Q in the inharmonic overtone becomes smaller than that in the main vibration, and thus the resonance sharpness becomes dull. Detrimental effect of inharmonic overtone as unwanted resonance thus reduces.

Figure 5:
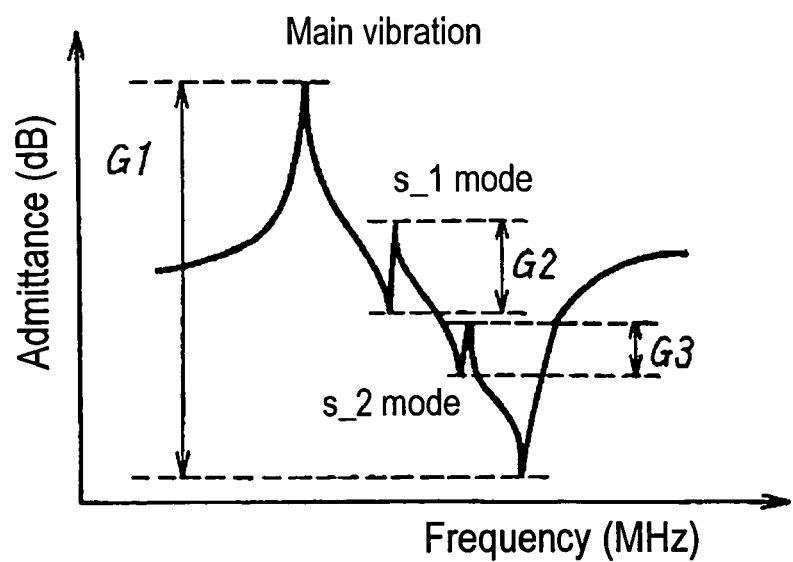
FIG. 5 illustrates gain difference in each vibration mode.

In FIG. 5, the gain difference between the resonance and anti-resonance of the main vibration is set to G1, the gain difference between the resonance and anti-resonance of the s_1 mode is set to G2, and the gain difference between the resonance and anti-resonance of the s_2 mode is set to G3 in admittance frequency characteristic of the oscillator. The relation between the gain difference in each vibration mode and resonance frequency of the main vibration is investigated as shown in FIG. 6 for the piezoelectric oscillator using zinc oxide as a piezoelectric material, being polarized in a thickness direction of the piezoelectric plate, and using thickness extension vibration as main vibration.

Figure 6:
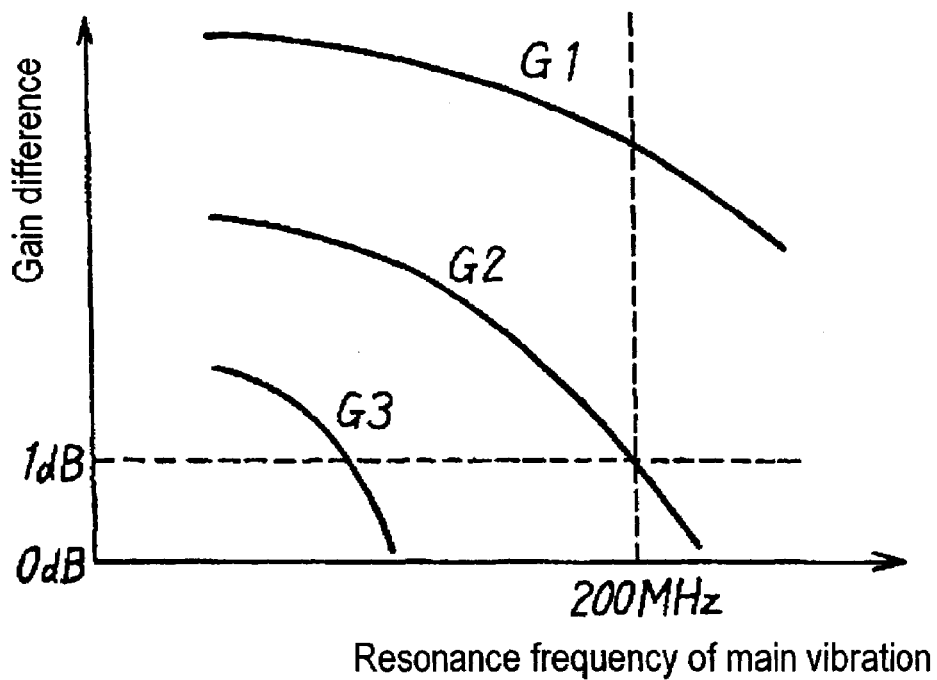
FIG. 6 illustrates the relation of gain difference in each vibration mode and resonance frequency of the main vibration in the piezoelectric oscillator using thickness extension vibration as main vibration.

In FIG. 6, Le/H is set to 22. It is apparent from FIG. 6 that the gain difference in each vibration mode becomes smaller as the frequency increases because Q reduces and resonance sharpness becomes dull. The level of reduction in gain difference is most obvious in the s_2 mode, and then the s_1 mode. The main vibration has the smallest reduction. It is also apparent from FIG. 6 that 200 MHz or higher resonance frequency is sufficient for the main vibration so as to avoid detrimental effect of unwanted resonance when the gain difference of inharmonic overtone is 1 dB or less.

Since the frequency constant of the main vibration resonance is about 3100 Hz·m, thickness of the oscillator needs to be 16 μm or thinner in order to achieve 200 MHz or higher resonance frequency for the main vibration. If the oscillator thickness is 16 μm or thinner, the gain difference in inharmonic overtone is small, and thus almost no detrimental effect of unwanted resonance occurs even Le/H is increased. Accordingly, the resonance impedance in the main vibration can be reduced. If Le/H is increased too much, however, the size of the entire oscillator becomes large, leading to reduced mechanical strength and higher cost. Accordingly, the upper limit of Le/H is set to 100.

Based on the above results, the resonance impedance in the main vibration is small when oscillator thickness H is 16 μm or less and Le/H is between 4 and 100 in the piezoelectric oscillator using zinc oxide as a piezoelectric material, being polarized in a thickness direction of the piezoelectric plate, and using thickness extension vibration as main vibration. In addition, stable characteristic without unwanted resonance between the resonance frequency and anti-resonance frequency of the main vibration is achievable.

Figure 7:
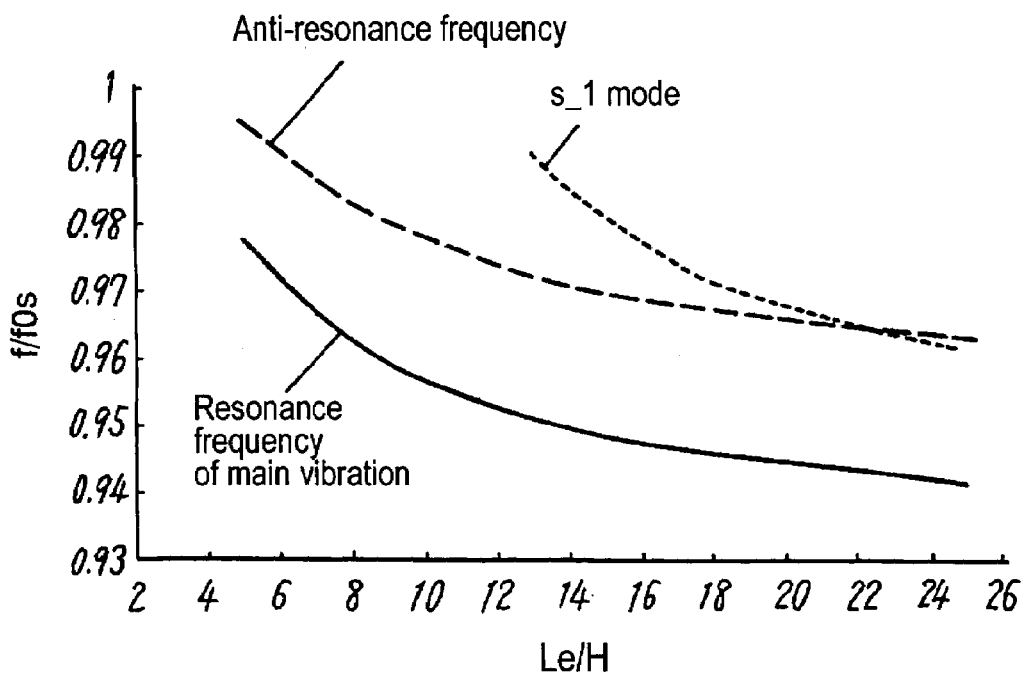
FIG. 7 illustrates frequency spectrum of the piezoelectric oscillator made of zinc oxide, polarized in a length direction of the piezoelectric plate, and using thickness shear vibration as main vibration.

Next, the piezoelectric oscillator which is polarized in a length direction of the piezoelectric plate and uses thickness shear vibration as main vibration is described. FIG. 7 shows the frequency spectrum of the piezoelectric oscillator using thickness shear vibration as main vibration. Le in FIG. 7 shows a long-side length of the driving electrode, and this length direction conforms to the vibrational displacement direction of thickness shear vibration.

It is apparent from FIG. 7 that same trend as that of thickness extension vibration can be found in thickness shear vibration. The s_1 mode is not output as signals when Le/H is 13 or less because it does not satisfy the energy trapping condition. The s_2 mode is not observed when Le/H is 25 or less. The s_1 mode exists between the resonance frequency and anti-resonance frequency of the main vibration when Le/H is 23 or above.

Accordingly, no unwanted resonance exists between the resonance frequency and anti-resonance frequency of the main vibration when Le/H is 23 or less. The lower limit of Le/H is set to 7 so as to avoid a fall in the electromechanical coupling coefficient.

Based on the above results, stable characteristic without unwanted resonance between resonance frequency and anti-resonance frequency of the main vibration is achievable when Le/H is between 7 and 23 in the piezoelectric oscillator using zinc oxide as a piezoelectric material, being polarized in a length direction of the piezoelectric material, and using thickness shear vibration as main vibration.

Figure 8:
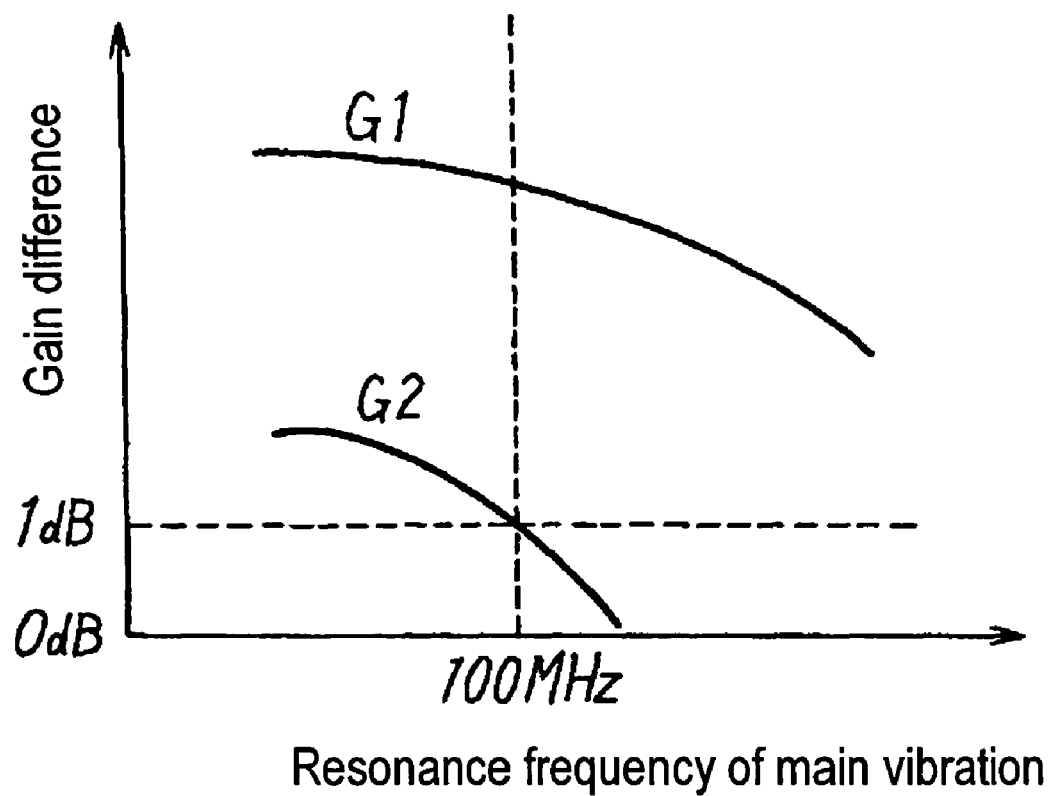
FIG. 8 illustrates the relation of gain difference in each vibration mode and resonance frequency of the main vibration in the piezoelectric oscillator using thickness shear vibration as main vibration.

Same as the case of using thickness extension vibration as main vibration, the gain difference in inharmonic overtone becomes smaller as operating frequency increases in the piezoelectric filter using thickness shear vibration as the main vibration. Accordingly, detrimental effect of unwanted resonance is not expected to occur. FIG. 8 shows the relation between the gain difference in the main vibration and each vibration mode of inharmonic overtone and the resonance frequency of the main vibration.

In FIG. 8, Le/H is 30. It is apparent from FIG. 8 that the same trend as when thickness extension vibration is used as main vibration is found. The gain difference in each vibration mode reduces as the frequency increases. The level of reduction in gain difference is larger in the s_1 mode than in the main vibration. It is apparent from FIG. 8 that 100 MHz or higher resonance frequency is sufficient for the main vibration so as to avoid detrimental effect of unwanted resonance when the gain difference in inharmonic overtone is 1 dB or less. Since the frequency constant of the main vibration resonance is about 1400 Hz·m, thickness of the oscillator needs to be 14 μm or thinner in order to achieve 100 MHz or higher resonance frequency for the main vibration.

The upper limit of Le/H is set to 100 based on the same reason as that using thickness extension vibration as main vibration. Based on the above results, Le/H needs to be set between 7 and 100 when thickness H of the oscillator is 14 μm or thinner so as to achieve stable characteristic without unwanted resonance between the resonance frequency and anti-resonance frequency of the main vibration in the piezoelectric oscillator using zinc oxide as a piezoelectric material, being polarized in a length direction of the piezoelectric plate, and using thickness shear vibration as main vibration.

By combining several oscillators, a band pass filter passing signals in a specific frequency band is manufactureable. In general, a ladder-type filter which uses resonance frequency and anti-resonance frequency of the oscillator as a pole of filter characteristic and sets frequencies between the resonance frequency and anti-resonance frequency as a passband is often manufactured. If unwanted resonance exists between the resonance frequency and anti-resonance frequency as characteristic of the oscillator, ripple exists in a passband as the filter characteristic. This results in degrading the characteristic. If the aforementioned oscillators are combined, stable filter characteristic without ripple in a passband is achievable because each oscillator features stable characteristic without unwanted resonance.

Filters other than ladder-type filters include a multi-mode filter in which multiple piezoelectric oscillators are disposed on one piezoelectric plate and their vibrations are coupled to establish a band pass filter. This type of filter is called MCF (monolithic crystal filter), and actively utilizes inharmonic overtone such as the a_0 mode and s_1 mode. A double-mode filter using two modes of s_0 and a_0 is described below.

Figure 9A:
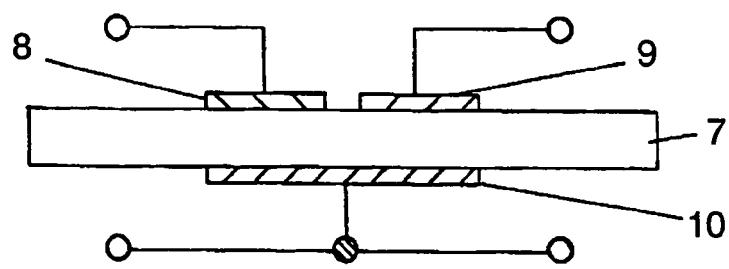
FIG. 9A is a sectional view of a double-mode piezoelectric filter and electric charge distribution.
Figure 9B:
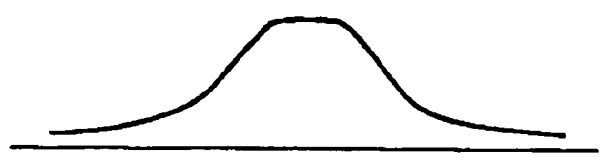
FIG. 9B is electric charge distribution of the double-mode piezoelectric filter.
Figure 9C:
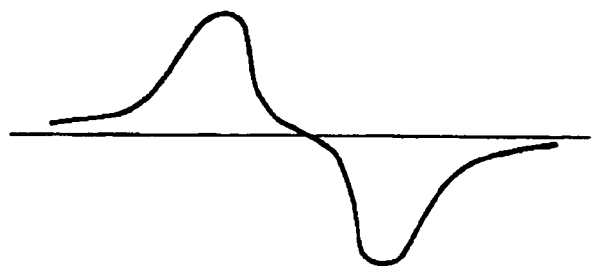
FIG. 9C is electric charge distribution of the double-mode piezoelectric filter.
Figure 10:
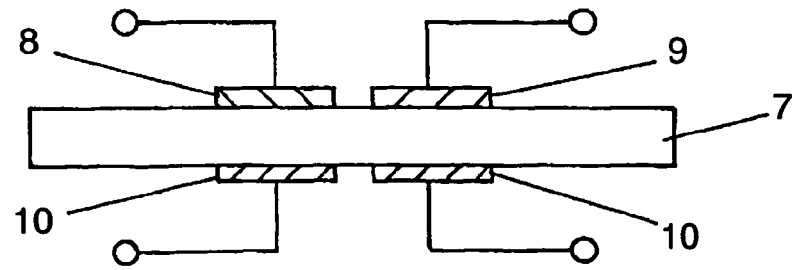
FIG. 10 is a sectional view of the double-mode piezoelectric filter.

FIG. 9A shows the structure of the double-mode filter. A pair of input electrode 8 and output electrode 9 are disposed at a minute distance on one main face of vibrating section 7 of a piezoelectric plate, and ground electrode 10 is disposed on the other main face. A band pass filter is created by generating the s_0 mode, which is a symmetry mode, and the a_0 mode, which is an asymmetry mode. FIGS. 9B and 9C show electric charge distribution in each mode. Only one ground electrode is provided in FIG. 9A, but ground electrode 10 can be provided facing each of input electrode 8 and output electrode 9 as shown in FIG. 10.

In order to avoid taking out vibrations, other than those in the s_0 mode or a_0 mode, which become unwanted resonance as electrical signals, an electrode needs to be designed in a way that modes higher that the s_1 mode do no satisfy the energy trapping condition. If the minute distance between input electrode 8 and output electrode 9 is designed as small as to be ignorable compared to input electrode length Li and output electrode length L0, the upper limit of ratio (Li+Lo)/H of the sum (Li+Lo) of input electrode length Li and output electrode length Lo to oscillator thickness H is equivalent to maximum Le/H that the s_1 mode of the oscillator does not satisfy the trapping condition.

In other words, if thickness extension vibration is used as main vibration, the upper limit of (Li+Lo)/H is 10. If thickness shear vibration is the main vibration, the upper limit is 13. The lower limit of (Li+Lo)/H is minimum Le/H which does not reduce the electromechanical coupling coefficient in case of the oscillator. If thickness extension vibration is used as main vibration, the lower limit is 4. If thickness shear vibration is the main vibration, the lower limit is 7.

In case of the double-mode filter, the input electrode length and output electrode length are often made the same so as to achieve electrically symmetric I/O characteristic. In case of the double-mode filter using zinc oxide as a piezoelectric material, being polarized in a thickness direction of the piezoelectric plate, and using thickness extension vibration as main vibration, ratio Li/H of input electrode length Li to oscillator thickness H and ratio Lo/H of output electrode length Lo to oscillator thickness H are respectively set between 2 and 5 in order to achieve stable filter characteristic without ripple in the passband. In case of the double-mode filter using zinc oxide as a piezoelectric material, being polarized in a length direction of the piezoelectric plate, and using thickness shear vibration as main vibration, Li/H and Lo/H are respectively set between 3.5 and 6.5 in order to achieve stable filter characteristic without ripple in a passband.

Specific exemplary embodiments of the present invention are described below with reference to FIGS. 11 to 17.

FIRST EXEMPLARY EMBODIMENT

Figure 11:
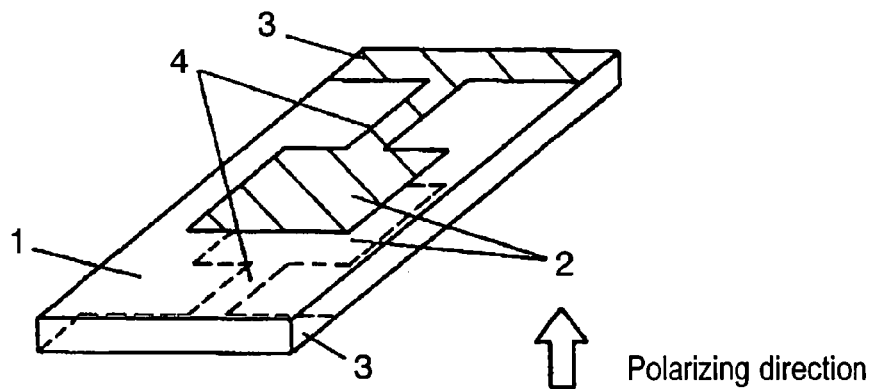
FIG. 11 is a perspective view of the piezoelectric oscillator in accordance with one exemplary embodiment of the present invention.

FIG. 11 is a piezoelectric oscillator which uses zinc oxide as a piezoelectric material, is polarized in a thickness direction of the piezoelectric plate, and uses thickness extension vibration as main vibration. This piezoelectric oscillator includes vibrating section 1, driving electrodes 2 disposed at positions facing each other on the top and bottom faces of vibrating section 1, lead electrode 3 and electrode 4 for external draw-out.

In the first exemplary embodiment, the resonance frequency is about 15 MHz so as to achieve oscillator thickness H of 200 μm. The driving electrode is square with 2 mm for each side. Accordingly, the ratio of the driving electrode length to oscillator thickness is 10. In other words, the ratio falls within the range of 4 to 13, achieving stable characteristic without unwanted resonance between the resonance frequency and anti-resonance frequency of the main vibration.

SECOND EXEMPLARY EMBODIMENT

Figure 12:
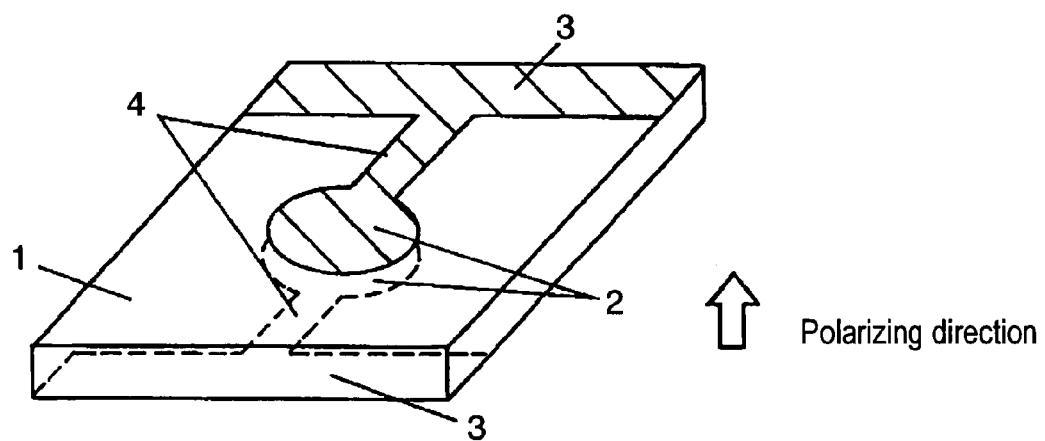
FIG. 12 is a perspective view of the piezoelectric oscillator in accordance with one exemplary embodiment of the present invention.

FIG. 12 is a piezoelectric oscillator which uses zinc oxide as a piezoelectric material, is polarized in a thickness direction of the piezoelectric plate, and uses thickness extension vibration as main vibration. This piezoelectric oscillator includes vibrating 1, driving electrodes 2 disposed at positions facing each other on the top and bottom faces of vibrating section 1, lead electrode 3, and electrode 4 for external draw-out.

The resonance frequency is about 1.5 GHz because oscillator thickness H is 2 μm. The driving electrode is a round electrode with 60 μm diameter. Its high operating frequency keeps the gain difference between the resonance and anti-resonance of inharmonic overtone small, achieving preferable characteristic without detrimental effect of unwanted resonance between the resonance frequency and anti-resonance frequency of the main vibration. In addition, low impedance and high Q for resonance of the main vibration are achievable.

THIRD EXEMPLARY EMBODIMENT

Figure 13:
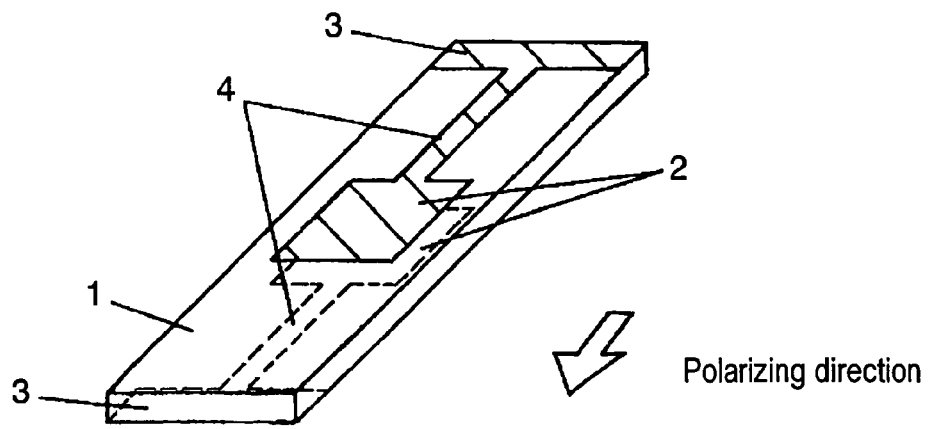
FIG. 13 is a perspective view of the piezoelectric oscillator in accordance with one exemplary embodiment of the present invention.

FIG. 13 is a piezoelectric oscillator which uses zinc oxide as a piezoelectric material, is polarized in a length direction of the piezoelectric plate, and uses thickness shear vibration as main vibration. This piezoelectric oscillator includes vibrating section 1, driving electrodes 2 disposed at positions facing each other on the top and bottom faces of vibrating section 1, lead electrode 3, and electrode 4 for external draw-out.

The resonance frequency is about 7 MHz because oscillator thickness H is 200 μm. Driving electrode length is 3 mm. This makes the ratio of the driving electrode length to oscillator thickness within the range of 7 to 23, achieving stable characteristic without unwanted resonance between the resonance frequency and anti-resonance frequency of the main vibration.

FOURTH EXEMPLARY EMBODIMENT

Figure 14:
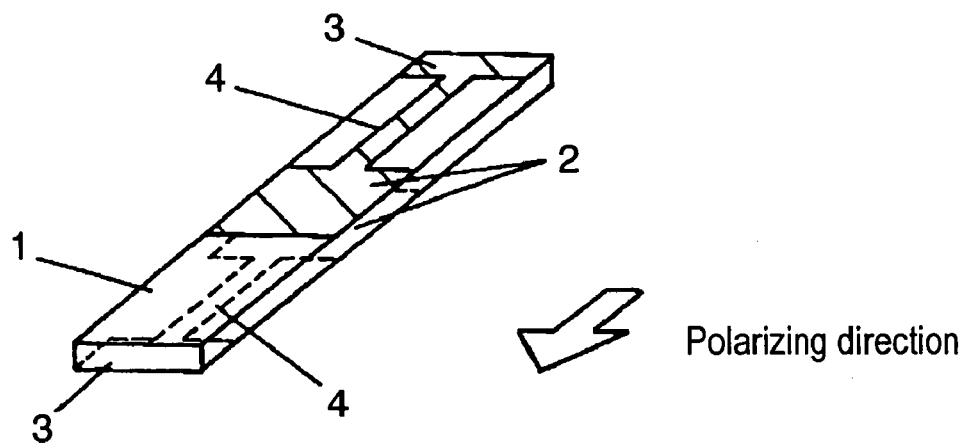
FIG. 14 is a perspective view of the piezoelectric oscillator in accordance with one exemplary embodiment of the present invention.

FIG. 14 is a piezoelectric oscillator which uses zinc oxide as a piezoelectric material, is polarized in a length direction of the piezoelectric plate, and uses thickness shear vibration main vibration. This piezoelectric oscillator includes vibrating section 1, driving electrodes 2 disposed at positions facing each other on the top and bottom faces of vibrating section 1, lead electrode 3, and electrode 4 for external draw-out.

The resonance frequency is about 700 MHz since oscillator thickness H is 2 μm. The driving electrode length is 80 μm, and is formed on the entire width of the oscillator in a width direction. Its high operating frequency keeps the gain difference between the resonance and anti-resonance of inharmonic overtone small, achieving preferable characteristic without detrimental effect of unwanted resonance between the resonance frequency and anti-resonance frequency of the main vibration. In addition, low impedance and high Q for resonance of the main vibration are achievable.

FIFTH EXEMPLARY EMBODIMENT

Figure 15:
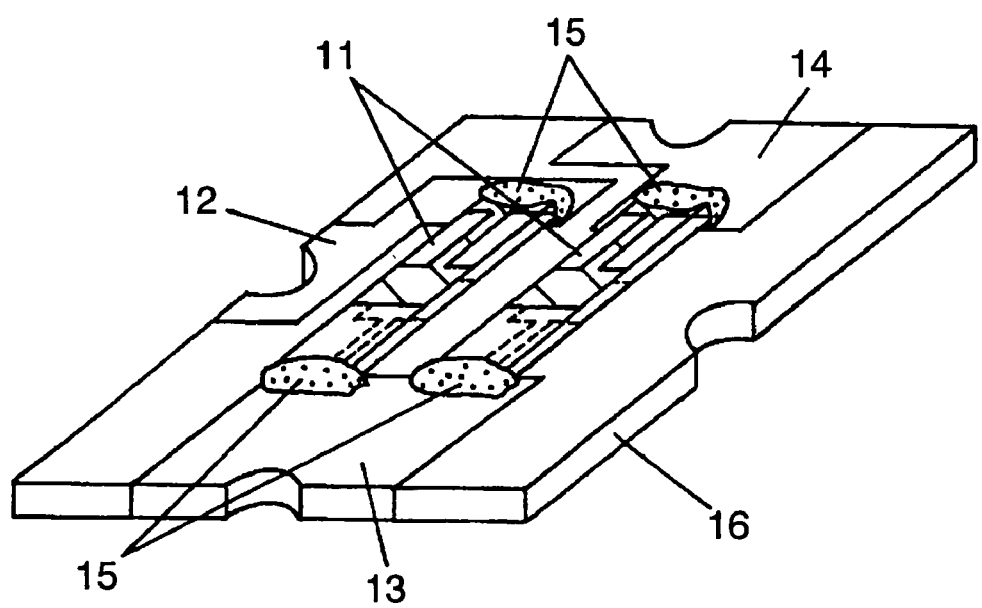
FIG. 15 is a perspective view of the piezoelectric oscillator in accordance with one exemplary embodiment of the present invention.

FIG. 15 is a ladder-type filter configured with two piezoelectric oscillators using zinc oxide as a piezoelectric material, being polarized in a length direction of the piezoelectric plate, and using thickness shear vibration as main vibration. This ladder-type filter includes piezoelectric oscillator 11, input external terminal 12, output external terminal 13, ground external terminal 14, conductive resin 15, and mounting board 16.

Both of oscillators used in the filter have 100 μm for oscillator thickness H and 1.5 mm for driving electrode length Le. Accordingly the ratio of the driving electrode length to oscillator thickness falls within the range of 7 to 23. This achieves preferable filter characteristic without ripple in a passband because no unwanted resonance exists between the resonance frequency and anti-resonance frequency of the main vibration of each oscillator.

SIXTH EXEMPLARY EMBODIMENT

Figure 16:
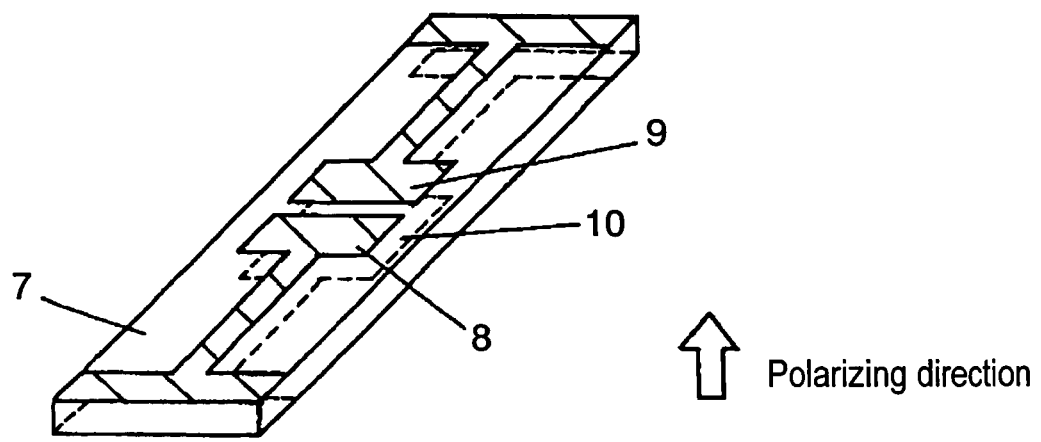
FIG. 16 is a perspective view of the piezoelectric oscillator in accordance with one exemplary embodiment of the present invention.

FIG. 16 is a double-mode piezoelectric filter which uses zinc oxide and thickness extension vibration as main vibration. This double-mode piezoelectric filter includes vibrating section 7, input electrode 8, output electrode 9, and ground electrode 10. The center frequency of the filter is about 62 MHz because oscillator thickness H is 50 μm. Input electrode length Li and output electrode length Lo are both 200 μm, and thus both ratio Li/H and Lo/H fall 4 which is involved in the range of 2 to 5. Accordingly, a preferable filter characteristic without ripple in a passband is achievable.

SEVENTH EXEMPLARY EMBODIMENT

Figure 17:
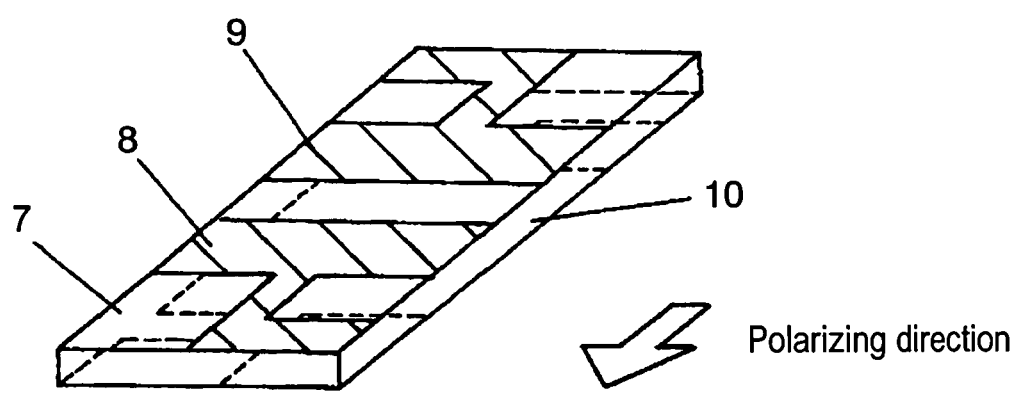
FIG. 17 is a perspective view of the piezoelectric oscillator in accordance with one exemplary embodiment of the present invention.
Figure 18:
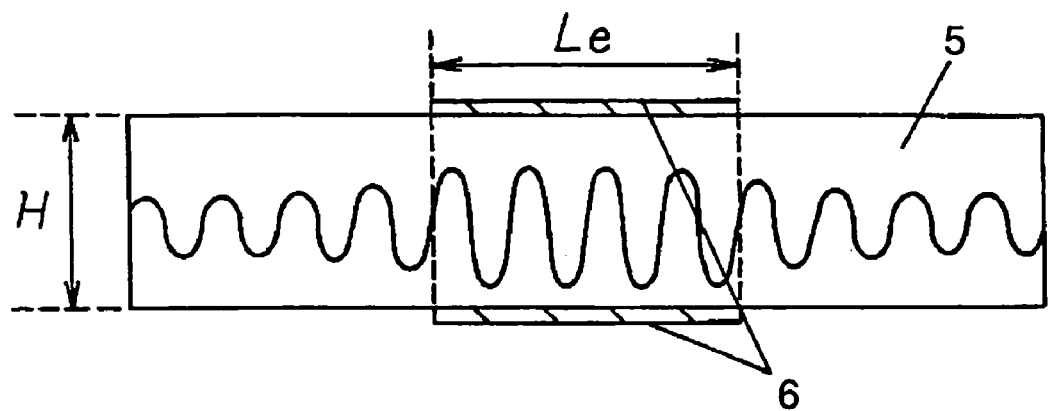
FIG. 18 is a sectional view of an energy-trapping piezoelectric oscillator.
Figure 19:
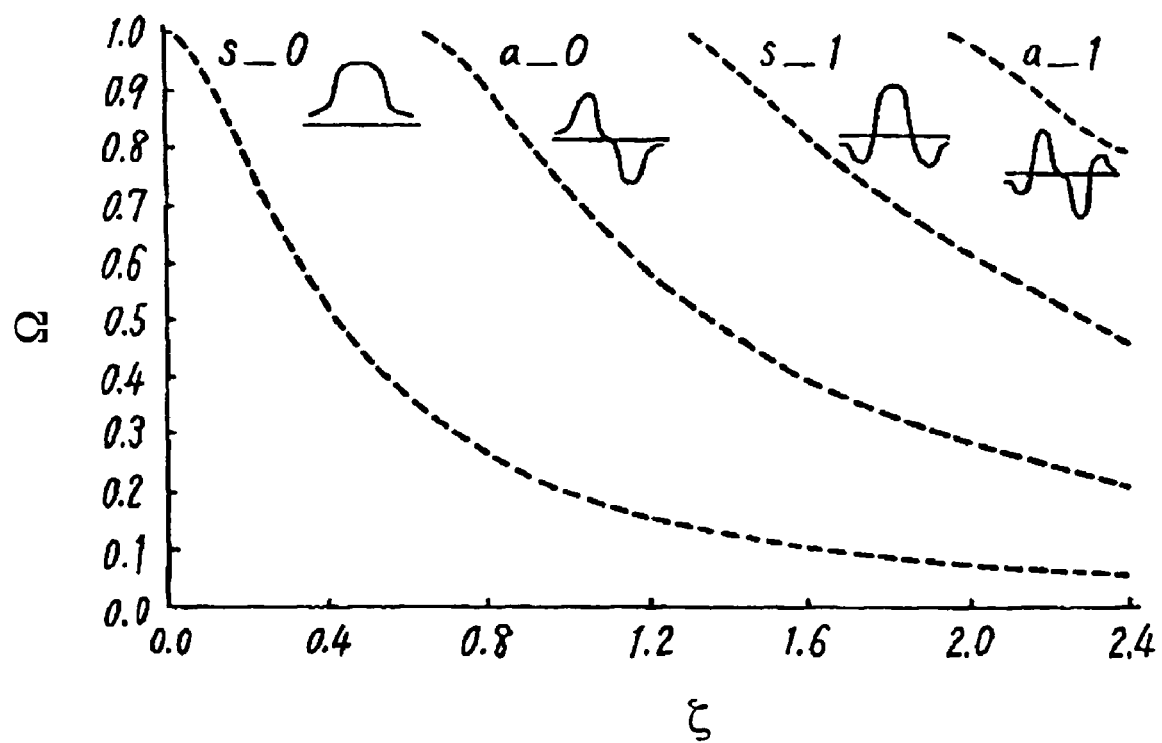
FIG. 19 is frequency spectrum of an energy-trapping thickness-shear oscillator using an X plate of lithium tantalate.

FIG. 17 is a double-mode piezoelectric filter which uses zinc oxide and thickness shear vibration as main vibration. This double-mode piezoelectric filter includes vibrating section 7, input electrode 8, output electrode 9, and ground electrode 10. The center frequency of the filter is about 35 MHz because oscillator thickness H is 40 μm. Input electrode length Li and output electrode length Lo are both 200 μm, and thus both ratio Li/H and Lo/H fall 5 which is involved in the range of 3.5 to 6.5. Accordingly, a preferable filter characteristic without ripple in a passband is achievable.

INDUSTRIAL APPLICABILITY

The present invention aims to offer the oscillator using zinc oxide as a piezoelectric material which does not cause unwanted resonance called inharmonic overtone by optimizing ratio Le/H of driving electrode length Le to oscillator thickness H. To achieve this object, ratio Le/H of driving electrode length Le to oscillator thickness H is set between 4 and 13 in the piezoelectric oscillator using zinc oxide as a piezoelectric material, being polarized in a thickness direction of the piezoelectric plate, and using thickness extension vibration as main vibration. For the piezoelectric oscillator polarized in a length direction of the piezoelectric plate and using thickness shear vibration as main vibration, Le/H is set between 7 and 23. This achieves stable characteristic without unwanted resonance between the resonance frequency and anti-resonance frequency of the main vibration.

Furthermore, a ladder-type piezoelectric filter or multi-mode piezoelectric filter employing the piezoelectric oscillator of the present invention achieves a significant effect of stable filter characteristic without ripple in a passband because each oscillator features stable characteristic without unwanted resonance.

The invention claimed is:
1. A piezoelectric oscillator comprising:
  piezoelectric plate and
  driving electrodes formed at positions corresponding to
    each other on both faces of said piezoelectric plate, and wherein said piezoelectric plate is made of zinc oxide,
wherein said piezoelectric plate is polarized in a thickness direction, uses thickness extension vibration as main vibration, and has thickness of not greater than 16 μm, and
dimensional ratio (Le/H) of electrode length (Le) of said driving electrodes facing each other to piezoelectric plate thickness (H) is between 4 and 100.

2. A piezoelectric oscillator comprising:
piezoelectric plate and
driving electrodes formed at positions corresponding to each other on both faces of said piezoelectric plate, and
wherein said piezoelectric plate is made of zinc oxide, is polarized in a thickness direction and uses thickness extension vibration as main vibration; and dimensional ratio (Le/H) of electrode length (Le) of said driving electrodes facing each other to piezoelectric plate thickness (H) is between 4 and 13,
wherein said piezoelectric oscillator is a piezoelectric filter in which one of said driving electrodes has a pair of input electrode and output electrode and the other electrode is ground electrode, and
wherein dimensional ratio Li/H of electrode length (Li) of said input electrode facing said ground electrode to piezoelectric plate thickness (H) and dimensional ratio Lo/H of electrode length (Lo) of said output electrode facing said ground electrode to piezoelectric plate thickness (H) are both between 2 and 5.

3. A piezoelectric oscillator comprising:
piezoelectric plate and
driving electrodes formed at positions corresponding to each other on both faces of said piezoelectric plate, and
wherein said piezoelectric plate is made of zinc oxide, is polarized in a length direction, uses thickness shear vibration as main vibration, and has thickness of not greater than 14 μm, and
dimensional ratio (Le/H) of long-side driving electrode length (Le) conforming to a vibrational displacement direction of said driving electrodes facing each other to piezoelectric plate thickness (H) is between 7 and 100.

4. A piezoelectric oscillator comprising:
piezoelectric plate and
driving electrodes formed at positions corresponding to each other on both faces of said piezoelectric plate, and
wherein said piezoelectric plate is made of zinc oxide, is polarized in a length direction, and uses thickness shear vibration as main vibration; and
dimensional ratio (Le/H) of long-side driving electrode length (Le) conforming to a vibrational displacement direction of said driving electrodes facing each other to piezoelectric plate thickness (H) is between 7 and 23,
wherein said piezoelectric oscillator is a piezoelectric filter in which one of said driving electrodes facing each other has a pair of input electrode and output electrode and the other electrode is a ground electrode, and
wherein dimensional ratio Li/H of electrode length (Li) of said input electrode facing said ground electrode to piezoelectric plate thickness (H) and dimensional ratio Lo/H of electrode length (Lo) of said output electrode facing said ground electrode to piezoelectric plate thickness (H) are both between 3.5 and 6.5.

5. A double-mode band-pass piezoelectric filter employing the piezoelectric oscillator defined in one of claim 2.

6. A band-pass piezoelectric filter combining a plurality of piezoelectric oscillators being configured in a ladder, each of said piezoelectric oscillators comprising:
a piezoelectric plate and
driving electrodes formed at positions corresponding to each other on both faces of said piezoelectric plate,
wherein said piezoelectric plate is made of zinc oxide, and dimensional ratio (Le/H) of electrode length (Le) of said driving electrodes facing each other to piezoelectric plate thickness (H) is between 4 and 100.

7. A piezoelectric oscillator as defined in claim 4, wherein said piezoelectric oscillator is included in a double-mode band-pass piezoelectric filter.

8. A band-pass piezoelectric filter combining a plurality of piezoelectric oscillators configured in a ladder, each of said piezoelectric oscillators comprising:
a piezoelectric plate and
driving electrodes formed at positions corresponding to each other on both faces of said piezoelectric plate, and
wherein said piezoelectric plate is made of zinc oxide, polarized in a thickness direction, uses thickness extension vibration as main vibration, and dimensional ratio (Le/H) of electrode length (Le) of said driving electrodes facing each other to piezoelectric plate thickness (H) is between 4 and 13.

9. A band-pass piezoelectric filter combining a plurality of piezoelectric oscillator defined in claim 1, said piezoelectric oscillator is one of a plurality of piezoelectric oscillators combined within a piezoelectric filter and configured in a ladder.

10. A band-pass piezoelectric filter combining a plurality of piezoelectric oscillators configured in a ladder, each of said piezoelectric oscillators comprising:
a piezoelectric plate, and
driving electrodes formed at positions corresponding to each other on both faces of said piezoelectric plate, and
wherein said piezoelectric plate is made of zinc oxide, polarized in a length direction, uses thickness shear vibration as main vibration, and the dimensional ratio (Le/H) of electrode length (Le) of said driving electrodes facing each other to piezoelectric plate thickness (H) is between 7 and 23.

11. A band-pass piezoelectric filter combining a plurality of piezoelectric oscillator defined in claim 3, said piezoelectric oscillator is one of a plurality of piezoelectric oscillators combined within a piezoelectric filter and configured in a ladder.

12. A double-mode band-pass piezoelectric filter employing the piezoelectric oscillator defined in one of claim 4.

13. A band-pass piezoelectric filter combining a plurality of piezoelectric oscillators configured in a ladder, each of said piezoelectric oscillators comprising:
a piezoelectric plate and
driving electrodes formed at positions corresponding to each other on both faces of said piezoelectric plate, and
wherein said piezoelectric plate is made of zinc oxide, polarized in a thickness direction, uses thickness extension vibration as main vibration, and dimensional ratio (Le/H) of electrode length (Le) of said driving electrodes facing each other to piezoelectric plate thickness (H) is between 4 and 13.

14. A band-pass piezoelectric filter combining a plurality of piezoelectric oscillators defined in claim 1, said piezoelectric filters being configured in a ladder.

15. A band-pass piezoelectric filter combining a plurality of piezoelectric oscillators defined in claim 3, said piezoelectric filters being configured in a ladder.

* * * * *